(12) United States Patent
Liu et al.

(10) Patent No.: US 7,079,717 B2
(45) Date of Patent: Jul. 18, 2006

(54) CONTROL CIRCUIT FOR IEEE 1394B OPTICAL TRANSMISSION PROTOCOL

(76) Inventors: Sam Liu, 1231 Alderwood Ave., Sunnyvale, CA (US) 94089; Yan Wang, 1362 Kingfisher Way, Apt. 1, Sunnyvale, CA (US) 94087

( * ) Notice: Subject to any disclaimer, the term of this patent is extended or adjusted under 35 U.S.C. 154(b) by 78 days.

(21) Appl. No.: 10/766,619

(22) Filed: Jan. 28, 2004

(65) Prior Publication Data
US 2005/0163457 A1 Jul. 28, 2005

(51) Int. Cl.
G02B 6/14 (2006.01)
H04B 10/08 (2006.01)
H04B 10/00 (2006.01)
H03K 5/22 (2006.01)
H03K 3/12 (2006.01)

(52) U.S. Cl. .............. 385/14; 398/22; 398/133; 398/134; 398/135; 398/136; 398/137; 398/138; 398/139; 327/73; 327/205

(58) Field of Classification Search ............ 323/222, 323/282, 284–287; 398/22, 30–33, 135–139; 327/73, 205; 385/14
See application file for complete search history.

(56) References Cited

U.S. PATENT DOCUMENTS

| 6,047,199 | A * | 4/2000 | DeMarco | 455/572 |
| 6,226,045 | B1 * | 5/2001 | Vidovich | 348/539 |
| 6,369,555 | B1 * | 4/2002 | Rincon-Mora | 323/282 |
| 6,411,068 | B1 * | 6/2002 | Willis | 323/282 |
| 2001/0036227 | A1 * | 11/2001 | Matsuo et al. | 375/224 |
| 2002/0027688 | A1 * | 3/2002 | Stephenson | 359/152 |
| 2004/0151198 | A1 * | 8/2004 | Brown et al. | 370/412 |
| 2004/0250174 | A1 * | 12/2004 | Sterrantino et al. | 714/43 |

* cited by examiner

Primary Examiner—Brian Healy
Assistant Examiner—Charlie Peng
(74) Attorney, Agent, or Firm—James Cai; Douglas MacKenzie; Schein & Cai LLP

(57) ABSTRACT

An On-Off control circuit between the IEEE1394a and IEEE1394b compliant physical layer (PHY) output driver circuitry and the glass fiber optical physical medium dependent (PMD) sub-layer within the architecture of the IEEE 1394b standard addresses the stability issue incurred by electronic circuit's inherent noise that interferes with the connection detecting procedure defined by the connection management protocol (CMP) of the IEEE 1394b standard. The circuit includes of a voltage divider to provide a reference voltage of about 50% of the output common mode voltage, a voltage comparator, and a feedback coupled to the positive input of the comparator to eliminate possible oscillation. The negative input of the comparator may be connected to the mid point of TPB termination network and the positive input of the comparator may be connected to the output of the voltage dividing circuit. The output of the comparator may be connected to the transmission enable bar input of the optical transceiver. In the process of connection detection, the common mode voltage of the TPB output toggles between 0 volt and 1.5 volt. Thus, the changing of the common mode voltage of TPB output driver circuitry will switch the optical transmitter on and off at a proper time to meet with the input signal definition requirements at the peer node according to the IEEE1394b standard.

4 Claims, 3 Drawing Sheets

Tone and Speed Signaling Timing Diagram

Extra Switching Caused by Noisy Input

CONTROL CIRCUIT FOR IEEE 1394B OPTICAL TRANSMISSION PROTOCOL

BACKGROUND OF THE INVENTION

The present invention generally relates to control circuits and more particularly to an on-off control circuit between an IEEE 1394a and IEEE 1394b compliant physical layer (PHY) output driver circuitry and a glass fiber optical physical medium dependent (PMD) sub-layer within the architecture of the IEEE 1394b standard.

Based upon technology developed by Apple Computer, Inc. of Cupertino, Calif., FireWire (IEEE 1394a or IEEE 1394-1995) was adopted in 1995 as an industry standard for cross-platform peripheral connectivity. The IEEE1394 serial bus is an easy, cost-effective, and high-performance means of interconnecting high-speed storage, imaging, and many other types of audio/video (ANV) devices, providing a convenient network interface, and being capable of supporting both asynchronous data transport such as IP as well as isochronous media streaming (AV/C).

In the IEEE 1394a standard, the device addressing is 64 bits wide, partitioned as 10 bits for bus ID, 6 bits for node ID and 48 bits for memory addresses. The result is the capability to address up to 1023 buses, with each having up to 63 nodes. Each node acts as a repeater, allowing nodes to be chained together to form a tree topology.

An updated version of the IEEE 1394a standard, IEEE 1394b, was released in 2002. The updated standard doubles the throughput of the original technology, dramatically increases the maximum distance of FireWire connections, and supports many new types of cabling. IEEE 1394b allows extensions to 800 Mbit/sec., and 1.6 Gbit/sec. and 3.2 Gbit/sec. over copper wires. The updated standard supports long-distance transfers to 100 meters over a variety of media: CAT-5 unshielded cable at 100 Mbit/sec., existing plastic optical fiber at 200 Mbits/sec., next-generation plastic optical fiber at 400 Mbit/sec. and 50-micron multimode glass optical fiber at up to 3.2 Gbit/sec. The improved speed and distance capabilities of IEEE 1394b result from two major improvements; overlapped arbitration and advanced 8B10B encoding scrambling both data and control symbols used by Fiber Channel and Gigabit Ethernet. This scrambling code results in much lower average attenuation—more than 20 dB below unscrambled codes. Together, the two improvements are called the beta mode of operation to distinguish it from the IEEE 1394a legacy mode.

Because the IEEE 1394b standard is backward compatible with the original IEEE1394a standard, the IEEE 1394b standard defines an IEEE 1394 PHY to be bilingual capable, that is, the IEEE 1394 PHY is capable of working either with a peer IEEE1394 device (beta mode) or with an IEEE1394a device (legacy mode). A mode determination algorithm is embodied within the connection management protocol at the very beginning of a connection establishing process.

In order to establish a connection between optical ports of two peer nodes interconnected with a glass fiber optical cable, a toning signal is generated and transmitted on Twisted Pair B (TPB+/−) of the IEEE 1394b PHY. Toning is the IEEE 1394b method for beta-mode connection determination. Toning makes use of a "tone" signal and a "tone" detector. An IEEE 1394b device is also listening to its peer port from a Twisted Pair A (TPA+/−) of its own, acting as a "tone" detector. The node is ready to detect the incoming signal as a tone if the peer device has an IEEE 1394b PHY or as a TPBias if the peer device has an IEEE 1394a PHY. When the peer node receives a tone signal, it recognizes that the other node is an IEEE 1394b device and a beta mode connection may be established.

The toning signal has a frequency of 50 MHz with a duration of 667 μsec and a period of 42.7 msec. At the receiver of an IEEE 1394 PHY, the tone must be a minimum of 400 μsec wide to be considered a valid tone. In other words, an IEEE 1394b PHY needs to see a toning signal of at least 400 μsec duration but not longer than 667 μsec duration. This gives the system a tolerance margin of 227 μsec as a timing budget to handle transmission loss considering the propagation delay caused by other in-line devices such as the on-off controller and the optical transceivers. During the tone the transmitter TPB signals are compliant to the level as specified in the IEEE 1394b standard. Between tones the transmitter is placed in high impedance or it is in a so-called quiet period when it is in the connection detect phase.

Once a valid tone is detected between the two connected IEEE 1394b nodes, a speed negotiation sequence is entered. Speed negotiation is a process in which two connected IEEE 1394b nodes can establish continuous operation at the correct operating speed and avoid any need for matching configuration options at "both" ends to determine what a "common denominator" operating speed should be. The same toning signals that were used in connection detection are again used in speed negotiation but the tones are sent in different patterns. Tones of the same electrical characteristics are sent at specified intervals to indicate speed capabilities. Both ports transmit a speed code indicating their respective maximum speeds, while simultaneously listening for the speed codes from the peer port. The ports then transmit the minimum of the transmitted and received speeds, together with an acknowledge bit (to indicate that the agreed speed has been received). When a port receives a speed code with the acknowledge bit set, then it ceases to transmit speed codes, and the connection is established. The speed code timing and encoding for this purpose is shown in FIG. 1.

Following the speed negotiation process, the nodes then can start sending symbols and align their clocks (also called training). Once the training sequence is completed, idle symbols are continually sent until data transfers are started.

The IEEE 1394b PHY receiver can only accept a "1", "0" or "z"(high impedance). The "z" means an open circuit or the input is floated. It is strictly constrained that between each tone nothing may be transmitted from the peer optical transmitter. The receiver must see a "z" from its input circuit. Noise transmitted from the peer optical transmitter may confuse the IEEE 1394b PHY receiver and disturb the initialization process. Noise may prevent the establishment of a connection between the two IEEE 1394b nodes.

A prior art solution to the problem of noise known as biasing-off is shown in FIG. 2. The biasing-off solution achieves noise elimination by unbalancing the bias voltage of the differential pair. This method can only be used in a system that has a DC coupled optical transceiver. With an AC coupled optical transceiver it is impossible to change the bias level from outside of the transceiver itself. As shown in FIG. 2, the LVPECL is normally biased at a level of 2.1V. By slightly lifting the bias of the differential pair's negative pole to 2.4V, the low 300 MV range is squeezed out. Because normal noise falls into this range the noise is "biased off" by the 300 MV bias unbalance between the differential pair. Although the approach works well in some cases, its disadvantages are obvious. Firstly, it can only work with a DC coupled optical transceiver. It will not work with systems having AC coupled optical transceivers. Secondly, because systems using such a solution apply a non-standard unbalanced bias, not only is the noise eliminated but the signal quality suffers from the unbalanced bias voltage at the same time. For these reasons this solution is not recommended by most component suppliers.

Another prior art solution to the problem of noise provides for the use of an optical transceiver having a squelched receiver. This solution suffers the disadvantage of being unreliable and costly.

There is therefore a need in the art for a control circuit between an IEEE 1394a and IEEE 1394b compliant physical layer (PHY) output driver circuitry and a glass fiber optical physical medium dependent (PMD) sub-layer within the architecture of the IEEE 1394b standard that turns off the optical transmitter during the periods between two consecutive tones and turns on the optical transmitter when a tone is present. Preferably the control circuit provides for smooth connection detection.

SUMMARY OF THE INVENTION

The control circuit of the present invention includes a voltage divider, a high speed voltage comparator, and a positive feedback network. When an IEEE 1394b PHY is sending a tone, the PHY transmitter (TPB+/−) outputs a 50 MHz signal that is 667 μsec wide with a typical common mode voltage ramping from 0V to 1.5V. This common mode voltage signal may be fed into the negative input of the comparator and is compared with a reference voltage of about 50% of the PHY output common mode voltage generated by the voltage divider at the positive input of the comparator. When the voltage at the positive input is greater than the voltage at the negative input a logic high may be output, otherwise a logic low is output. When a tone is present the TPB's common mode voltage signal will ramp up from 0V and cross over the reference level then finally settle at 1.5V during the 667μsec tone period. When the voltage signal crosses the reference level, the comparator's output instantly transitions to the logic low from the logic high. During the quiet period between two consecutive tones, the common mode voltage remains at a 0V level. The output of the comparator may be connected to the TxEn$_{13}$Bar input of the optical transceiver so as to disable the transmitter when the comparator output it is at the logic high and enable the transmitter when it is at the logic low. In this manner, when a tone is present the optical transmitter is enabled and during the quiet period between two consecutive tones the optical transmitter is disabled.

The positive feedback network provides for improvement in the comparator's transient response to avoid possible oscillation. Since in general a comparator circuit (used without positive feedback) may cause the output to switch every time (IN+-IN−) crosses zero, noisy input may cause the comparator to switch many times when IN+ is near IN−, especially when the input is slowly changing as shown in FIG. 3. In a worst case, oscillation may occur. To solve this problem, a portion of the comparator's output is feedback to the comparator's positive input to introduce a difference in the comparator switch point depending upon the direction in which the input is going. A small hysteresis difference window is thereby introduced to ensure that the comparator may only switch once when the input is going in a single direction across the switching point as long as the noise amplitude is within the window's range.

In accordance with one aspect of the invention, a control circuit includes a comparator having a first input for receiving an input signal and an output for providing an output signal, a reference voltage source coupled to a comparator second input, and a feedback network coupled to the second input for providing a hysteresis window.

In accordance with another aspect of the invention, an optical transmitter control circuit includes a comparator having a negative input coupled to an output common mode voltage of an IEEE 1394 PHY and an output coupled to an optical transmitter transmit enable bar input, a voltage divider coupled to a comparator positive input, and a feedback network coupled to the comparator positive input.

In another aspect of the invention, an optical transmitter control circuit coupled between an IEEE 1394 PHY TPB+/− termination network and an optical transmitter includes a comparator having a negative input coupled to the termination network and an output coupled to an optical transmitter transmit enable bar input, a voltage divider coupled to a comparator positive input, and a feedback network coupled to the comparator positive input.

In yet another aspect of the invention, an optical transmitter control circuit coupled between an IEEE 1394 compliant physical layer output driver circuitry and a glass fiber optical physical medium dependent sub-layer includes a comparator having a negative input coupled to the output driver circuitry and an output coupled to a glass fiber optical physical medium dependent sub-layer transmit enable bar input, a voltage divider providing a reference voltage to a comparator positive input, and a feedback network coupled to the comparator positive input for eliminating oscillation.

In yet another aspect of the invention, an optical transmitter control circuit includes a comparator having a negative input coupled to a termination network and an output coupled to an optical transmitter transmit enable bar input, a voltage divider coupled to a comparator positive input, and a feedback network coupled to the comparator positive input for providing a hysteresis window.

In yet another aspect of the invention, an optical transmitter control circuit coupled between an IEEE 1394 compliant physical layer output driver circuitry and a glass fiber optical physical medium dependent sub-layer includes a comparator having a negative input coupled to the output driver circuitry and an output coupled to a glass fiber optical physical medium dependent sub-layer transmit enable bar input, a voltage divider providing a reference voltage to a comparator positive input, and a feedback network coupled to the comparator positive input for providing a hysteresis window.

These and other features, aspects and advantages of the present invention will become better understood with reference to the following drawings, description and claims.

DETAILED DESCRIPTION OF THE INVENTION

Figure 1:
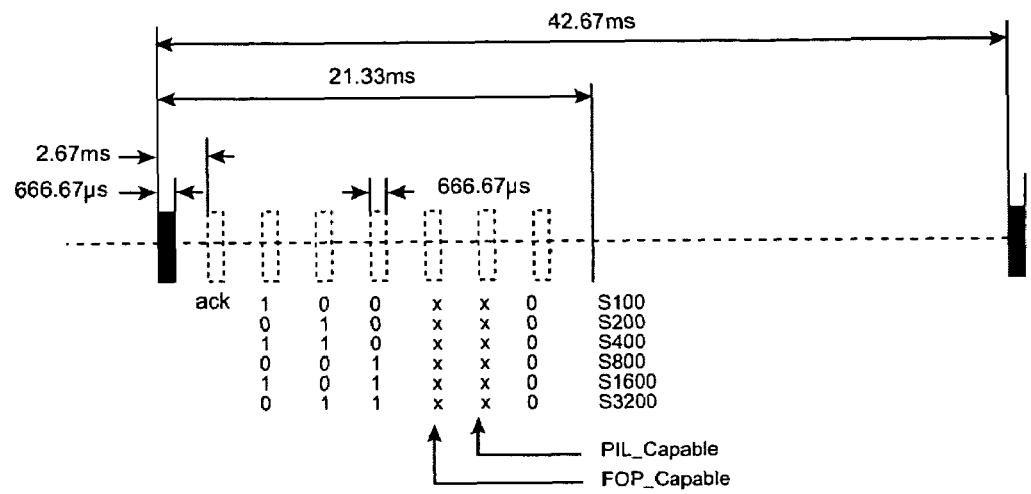
FIG. 1 is a timing diagram showing tone and speed signaling timing between two IEEE 1394b nodes.
Figure 2:
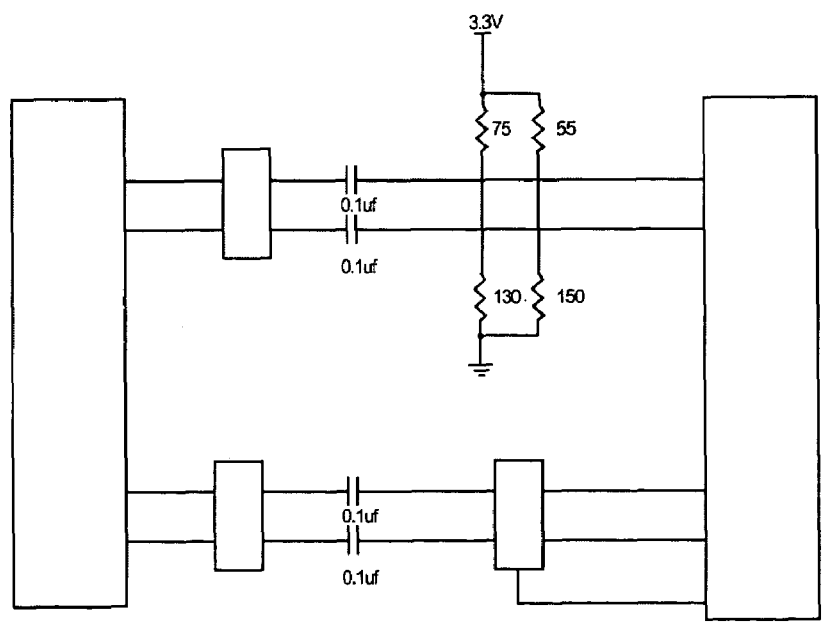
FIG. 2 is a schematic representation of a prior art circuit.
Figure 3:
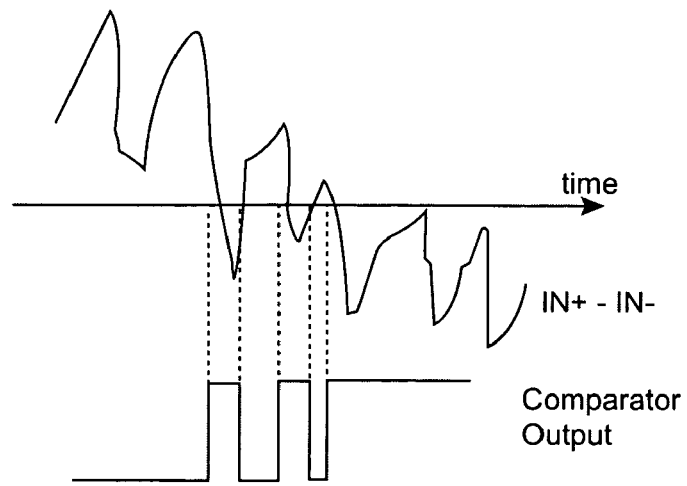
FIG. 3 is a graph showing extra comparator switching caused by a noisy input.
Figure 4:
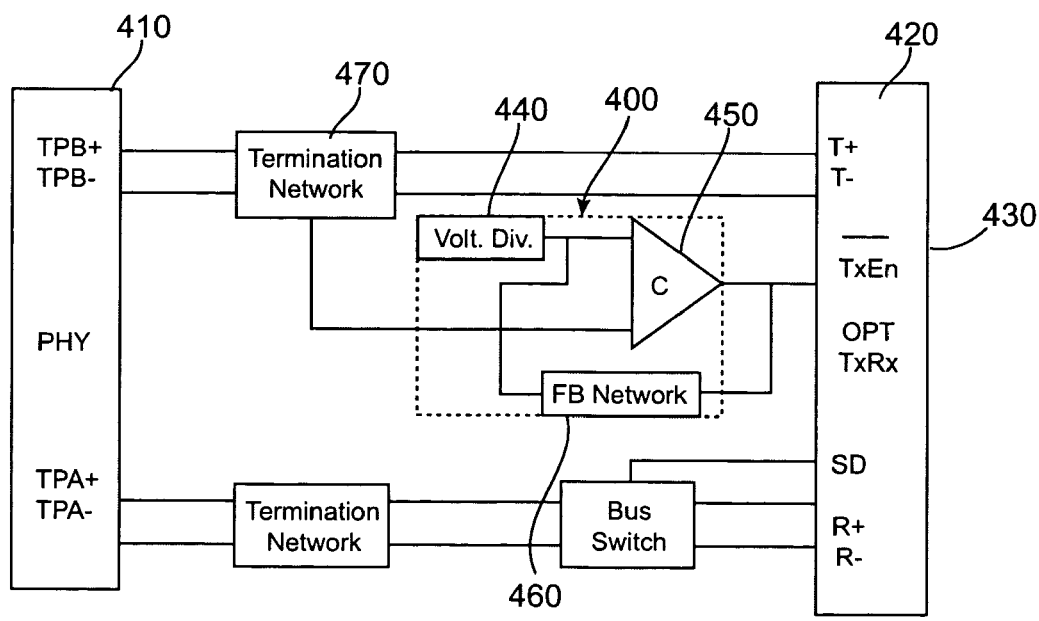
FIG. 4 is a schematic block representation of an optical transmitter control circuit in accordance with the present invention.

With reference to FIG. 4, an optical transmitter control circuit generally designated 400 is shown coupled between an IEEE1394 PHY 410 and an AC coupling glass fiber optical transceiver 420 with a TxEn_Bar input 430. The control circuit 400 may include a voltage divider 440, a high speed voltage comparator 450 and a feedback network 460. The high speed voltage comparator 450 may include a LinCMOS™ voltage comparator model TLC372 from Texas Instruments, Inc.

Figure 5:
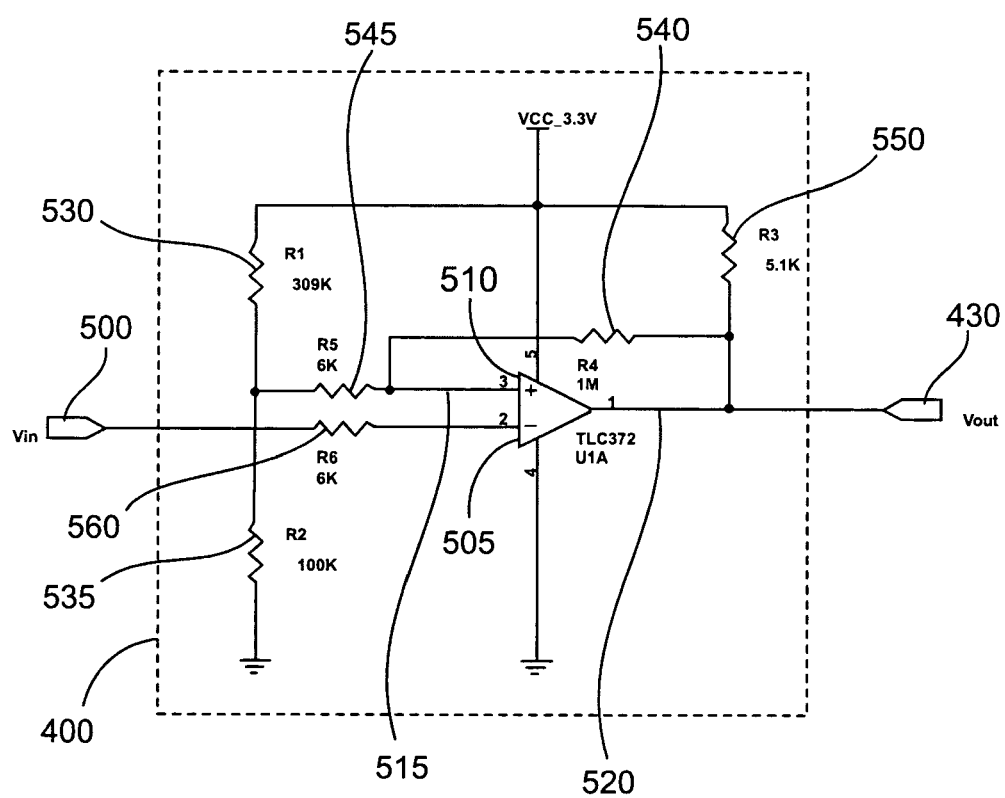
FIG. 5 is a schematic representation of the optical transmitter control circuit in accordance with the present invention.

With reference to FIG. 5, a common mode voltage signal 500 from the IEEE 1394b PHY's TPB+/− termination network 470 may be connected to a first input including a negative input 505 of the comparator 450 as a trigger. A voltage reference source including a voltage divider output 515 may be connected to a second input including a positive input 510 of the comparator 450 to provide a voltage reference. A comparator output 520 may be connected to the TxEn_Bar 430 of the optical transceiver 420 to switch on and off the optical transmitter 420. The feedback network 460 may send a portion of the comparator's output 520 back to the positive input 510 of the comparator 450 to improve the circuit's transient response.

The voltage divider 440 may include a resistors R1 530 and R2 535. The feedback network may include resistors R4 540 and R5 545. A resistor R3 550 may be a pull up resistor. To balance the inputs 505 and 515 of comparator 450, a resistor R6 560 may be inserted between common mode voltage signal 500 and the comparator's negative input 505.

In operation, the voltage divider 440 may provide the reference voltage to the positive input 510 through resistor R5 545. The mid point of the IEEE 1394b PHY's TPB (+/−) termination network 470 carrying the differential pair's common mode voltage signal is connected to the negative input 505 through the resistor RO 560. The comparator's output 520 may be connected to the optical transceivers TxEn$_{13}$Bar input 430.

In the process of connection detection, when the IEEE 1394b PHY's TPB (+/−) 410 sends out a tone, the pairs common mode voltage typically ramps up from 0V to 1.5V. The reference voltage at positive input 510 is preferably approximately at the mid point of the range. When the input voltage at the negative input 505 crosses above the reference voltage the comparator's output 520 may toggle from logic high to logic low, hence enabling the optical transmitter 420. During the quiet period between two consecutive tones, the negative input 505 may be at 0V and the comparator's output 520 may remain at logic high and the optical transmitter 420 Is disabled.

The feedback network 460 may send 6/1000 of the comparator's output 520 back to positive input 510 to improve the comparator's switching behavior so that oscillations that can damage the circuit's functionality are not likely. The hysteresis window size is a key parameter in the optical transmitter control circuit 400 design and needs to be handled properly. The window size may be determined by many factors such as the reference voltage level, the output high voltage level, value of the source resistor R5 545 and the feedback resistor R4 540. In a preferred embodiment, a 10 mV hysteresis window may be needed based upon experimental data. The rationale behind this can be clearly understood with reference to equation 1, $$V_{hyst} + (Vout_{high} - Vin_{ref}) * \frac{R5}{R4} \qquad \text{Equation 1}$$

in which,
$V_{hyst}$ is the desired hysteresis
$Vout_{high}$ is the high level output voltage
$Vin_{ref}$ is the input reference voltage level
$R_5$ is the source (input) resistor
$R_4$ is the feedback resistor The optical transmitter control circuit 400 of the present invention provides a simple, low cost solution to the connectivity issues that may be encountered when two IEEE1394 devices attempt to establish a connection through a long haul glass fiber optical channel. By using a proper amount of hysteresis (positive feedback) in the optical transmitter control circuit 400, a higher voltage supply for a higher speed comparator is not necessary. The comparator 450 can advantageously share the existing 3.3V power supply without incurring increases in engineering costs to provide an additional power supply to the comparator circuit. Furthermore, the optical transmitter control circuit 400 does not sacrifice the data signal quality.

We claim:

1. An on-off control circuit between an IEEE 1394a and IEEE 1394b compliant physical layer outout driver circuitry and an optical transceiver, the on-off control circuit comprising:
    a comparator having a first input for receiving an input signal from the output driver circuitry and an output for providing an output signal to the optical transceiver;
    a reference voltage source coupled to a comparator second input;
    a feedback network coupled to the second input for providing a hysteresis window; and
    wherein the optical transceiver is enabled during a period in which the output driver circuitry is sending a tone, and disabled during an interval between tones.

2. The control circuit of claim 1, wherein the comparator is a high speed voltage comparator.

3. The control circuit of claim 1, wherein the input signal comprises an output common mode voltage.

4. The control circuit of claim 1, wherein the output signal is coupled to a transmit enable bar input of the optical transceiver.

* * * * *